(12) United States Patent
Goldan et al.

(10) Patent No.: US 11,183,604 B2
(45) Date of Patent: *Nov. 23, 2021

(54) SELENIUM PHOTOMULTIPLIER

(71) Applicant: The Research Foundation for The State University of New York, Albany, NY (US)

(72) Inventors: Amirhossein Goldan, Stony Brook, NY (US); Wei Zhao, East Setauket, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/061,035

(22) Filed: Oct. 1, 2020

(65) Prior Publication Data
US 2021/0028317 A1 Jan. 28, 2021

Related U.S. Application Data

(62) Division of application No. 16/068,585, filed as application No. PCT/US2017/012714 on Jan. 9, 2017, now Pat. No. 10,825,939.
(Continued)

(51) Int. Cl.
*H01L 31/0272* (2006.01)
*H01L 31/0376* (2006.01)
(Continued)

(52) U.S. Cl.
CPC ...... *H01L 31/0272* (2013.01); *H01L 31/0376* (2013.01); *H01L 31/054* (2014.12);
(Continued)

(58) Field of Classification Search
CPC ............... H01L 31/107; H01L 31/0272; H01L 31/0232; H01L 31/0376
See application file for complete search history.

(56) References Cited

U.S. PATENT DOCUMENTS

| 7,256,402 | B1 * | 8/2007 | Lee | ............... G01T 1/241 |
| | | | | 250/370.09 |
| 2007/0207571 | A1 * | 9/2007 | Morisue | ............ H01L 29/78603 |
| | | | | 438/107 |
| 2012/0038013 | A1 * | 2/2012 | Karim | ............ H01L 31/022408 |
| | | | | 257/432 |

FOREIGN PATENT DOCUMENTS

| WO | WO 2014015285 | 1/2014 |
| WO | WO 2014194071 | 12/2014 |
| WO | WO 2015058199 | 4/2015 |

OTHER PUBLICATIONS

South Korean Office Action dated Jul. 14, 2020 issued in counterpart appl. No. 10-2018-70224787.
(Continued)

*Primary Examiner* — Wasiul Haider
(74) *Attorney, Agent, or Firm* — The Farrell Law Firm, P.C.; John F. Gallagher, III

(57) ABSTRACT

Provided is a field shaping multi-well photomultiplier and method for fabrication thereof. The photomultiplier includes a field-shaping multi-well avalanche detector, including a lower insulator, an a-Se photoconductive layer and an upper insulator. The a-Se photoconductive layer is positioned between the lower insulator and the upper insulator. A light interaction region, an avalanche region, and a collection region are provided along a length of the photomultiplier, and the light interaction region and the collection region are positioned on opposite sides of the avalanche region.

20 Claims, 6 Drawing Sheets

Related U.S. Application Data

(60) Provisional application No. 62/275,927, filed on Jan. 7, 2016.

(51) Int. Cl.

| | |
|---|---|
| *H01L 31/054* | (2014.01) |
| *H01L 31/107* | (2006.01) |
| *H01L 31/08* | (2006.01) |
| *H01L 31/10* | (2006.01) |
| *H01L 31/20* | (2006.01) |

(52) U.S. Cl.
CPC ............ *H01L 31/085* (2013.01); *H01L 31/10* (2013.01); *H01L 31/107* (2013.01); *H01L 31/20* (2013.01); *Y02E 10/52* (2013.01)

(56) References Cited

OTHER PUBLICATIONS

PCT/ISA/210 Search Report issued on PCT/US2017/012714, pp. 3.
PCT/ISA/237 Written Opinion issued on PCT/US2017/012714, pp. 4.
Reznik, A. et al., Avalanche multiplication phenomenon in amorphous semiconductors: Amorphous selenium versus hydrogenated amporphous silicon, Journal of Applied Physics 102, 05377 (2007), Copyright 2007 American Institute of Physics, pp. 8.
Bubon, Oleksandr et al., Amorphous selenium (a-SE) avalanche photosensor with metal electrodes, Journal of Non-Crystalline Solids 358 (2012), Copyright 2012 Elsevier B.V., pp. 4.
A.H. Goldan et al., "Amorphous Selenium Lateral Frisch Photodetector and Photomultiplier for High Performance Medical X-ray and Gamma-ray Imaging Applications", Proceedings of SPIE, SPIE Medical Imaging 2010, XP055605147, vol. 7622, Mar. 4, 2010, pp. 7.
Christos Hristovski et al., "Characterization and Comparison of Lateral Amorphous Semiconductors with Embedded Frisch Grid Detectors on 0.18um CMOS Processed Substrate for Medical Imaging Applications", Medical Imaging 2011: Physics of Medical Imaging, XP060008300, Proc. of SPIE vol. 7961, Mar. 3, 2011, pp. 9.
European Search Report dated Jul. 24, 2019 issued in counterpart application No. 17736512.9—1230, pp. 6.
European Search Report dated Mar. 5, 2020 issued in counterpart application No. 17736512.9—1230, pp. 4.

\* cited by examiner

SELENIUM PHOTOMULTIPLIER

PRIORITY

This application is a Divisional Application of U.S. patent application Ser. No. 16/068,585, filed with the U.S. Patent and Trademark Office on Jul. 6, 2018, as a National Phase entry of PCT/US2017/12714, filed Jan. 9, 2017, and claims priority to U.S. Provisional Patent Application No. 62/275,927 filed with the U.S. Patent and Trademark Office on Jan. 7, 2016, the content of each of which is incorporated herein by reference.

GOVERNMENT SUPPORT

This invention was made with government support under EB019526 and EB002655 awarded by the National Institutes of Health. The government has certain rights in the invention.

BACKGROUND OF THE INVENTION

1. Field of the Invention

The present invention relates generally to the field of solid-state radiation imaging detectors and, in particular, to amorphous selenium radiation detectors having a field-shaping multi-well detector structure.

2. Description of the Related Art

The field of nuclear medicine and its applications in diagnostic imaging is growing fast and the use of solid-state photomultipliers, in the form of single element or pixel array detectors, have been under investigation to yield performance characteristics similar to a conventional photomultiplier tube (PMT). Advantages of solid-state technology are ruggedness, compact size, and insensitivity to magnetic fields. Thus far, silicon photomultipliers (SiPMs) which are built from an avalanche photodiode (APD) array seem to be the only candidate for the replacement of PMI's in positron emission tomography (PET) and single-photon emission computed tomography (SPECT) imaging and are rapidly developing. However, in contrast to SiPMs do not operate in a linear mode and suffer from poor photon detection efficiency, small area, high cost, poor uniformity, and low yield.

To achieve avalanche gain ($g_{av}$) similar to a PMT of approximately $10^6$, SiPMs are operated above breakdown in non-linear Geiger-mode which results in optical crosstalk. For high gain APDs which are linear-mode devices, the avalanche multiplication process due to impact ionization is stochastic and produces excess noise.

Fluctuations in the avalanche gain become progressively worse as the multiplication factor (M) is increased in APDs by raising the electric field (F). The slope of M versus F is a strong function of the ratio of the two carriers' ionization rates (k), where $1 \leq k < 0$ given that the ideal situation of single-carrier multiplication is seldom if ever the case in practical semiconductor materials, and that both electrons and holes can have impact ionizations. [1] The high k-value in crystalline silicon contributes to the uniformity and yield issues of APDs and SiPMs. Amorphous selenium (a-Se), which was previously developed for photocopying machines, is the only exception to this criterion.

a-Se is readily produced uniformly over large area at substantially lower cost compared to crystalline solids, and a-Se is the only amorphous material that produces avalanche at high fields. A key feature of this impact ionization process is that only holes become hot carriers and undergo avalanche multiplication. Consequently, avalanche selenium devices are linear-mode devices with a very low k value. Commercially, avalanche gain in a-Se enabled the development of the first optical camera with more sensitivity than human vision and, for example, capable of capturing astronomical phenomena such as auroras and solar eclipses. [2] a-Se has ~90% detection efficiency in the blue wavelength which makes it ideal to be coupled to blue-emitting scintillators for high-energy radiation detection. a-Se is a room-temperature semiconductor with wide band gap and ultra-low leakage current even at high fields.

Limitations of direct conversion a-Se FPDs include degradation of low-dose imaging performance due to electronic noise since the energy required to generate an electron-hole pair in a-Se is 50 eV at 10 V/micron. Although other photoconductive materials with higher conversion have been investigated, direct conversion a-Se FPDs remain far from commercialization due to charge trapping and manufacturing issues. Improved conversion of a-Se is possible by increasing the electric field above 30 V/micron, i.e., 30,000 V on a 1000 micron layer. However, this electric field increase is extremely challenging for reliable detector construction and operation, and is impractical.

Amorphous solids, i.e., non-crystalline solids with disorder, have been ruled out as viable radiation imaging detectors in a photon-counting mode because of low temporal resolution due to low carrier mobility and transit-time limited pulse response, and low conversion gain of high energy radiation to electric charge. A direct conversion a-Se layer with separate absorption and avalanche region has been suggested, but significant obstacles prevent practical implementation of a direct conversion a-Se layer with separate absorption and avalanche regions.

Unipolar solid-state detectors with a Frisch grid have been proposed. However, such detector structures are not practical for direct conversion avalanche gain because the highest electric field in the well develops at the interface between the semiconductor and the pixel electrode, resulting in a high dark current due to large charge injection and potentially irreversible damage to the detector.

A unipolar time-differential (UTD) solid-state detector has been fabricated using a high granularity micro pattern multi-well structure, i.e., a multi-well solid-state detector (MWSD), Also proposed are vertical detector structures based on UTD charge sensing and avalanche multiplication gain, i.e., a field-shaping multi-well avalanche detector (SWAD) and the nano-electrode multi-well high-gain avalanche rushing photodetector (NEW-HARP) [5-6].

SUMMARY OF THE INVENTION

Provided herein is a multi-well selenium detector and a method for the fabrication of same that overcomes the shortcomings of conventional systems, which improves signal rise time set by the spreading of a photo-induced carrier packet.

Accordingly, aspects of the present invention address the above problems and disadvantages and provide the advantages described below. An aspect of the present invention provides a single-carrier solid-state photomultiplier device structure that uses amorphous selenium (a-Se) as the photoconductive material with indirect x-ray and gamma-ray detection capability when coupled to scintillating crystals.

An aspect of the present disclosure provides a photomultiplier with a field-shaping multi-well avalanche detector, comprising a lower insulator; an a-Se photoconductive layer; and an upper insulator. The a-Se photoconductive layer is between the lower insulator and the upper insulator. A light interaction region, an avalanche region, and a collection region are provided along a length of the photomultiplier, and the light interaction region and the collection region are positioned on opposite sides of the avalanche region.

Another aspect of the present disclosure provides a photomultiplier with a field-shaping multi-well avalanche detector, comprising an insulator, a-Se photoconductive layer adjacent to the insulator, a light interaction region, an avalanche region and a collection region. The light interaction region, the avalanche region, and the collection region are provided along a length of the photomultiplier, and the light interaction region and the collection region are positioned on opposite sides of the avalanche region.

BRIEF DESCRIPTION OF THE DRAWINGS

The above and other aspects, features and advantages of certain embodiments of the present invention will be more apparent from the following detailed description taken in conjunction with the accompanying drawings, in which.

DETAILED DESCRIPTION OF EMBODIMENTS OF THE INVENTION

The following detailed description of certain embodiments of the present invention will be made with reference to the accompanying drawings. In describing the invention, explanation about related functions or constructions known in the art are omitted for the sake of clearness in understanding the concept of the invention, to avoid obscuring the invention with unnecessary detail.

Disclosed herein is a solid-state avalanche radiation detector, and a method for constructing same, using amorphous material as the photoconductive layer. The solid-state avalanche radiation detector is based on field-shaping by localizing the high-field avalanche region between a plurality of low-field regions, improving on the devices of Sauli [7]1, U.S. Pat. No. 6,437,339 to Lee, et al., U.S. Pat. No. 8,129,688 to A. H. Goldan, et al., U.S. Pat. Publ. No. 2016/0087113 A1 of U.S. application Ser. No. 14/888,879 to A. H. Goldan, et al. and U.S. Pat. Publ. No. 2015/0171232 A1 of U.S. application Ser. No. 14/414,607 to A. H. Goldan, et al., the content of each of which is incorporated herein by reference.

Figure 1:
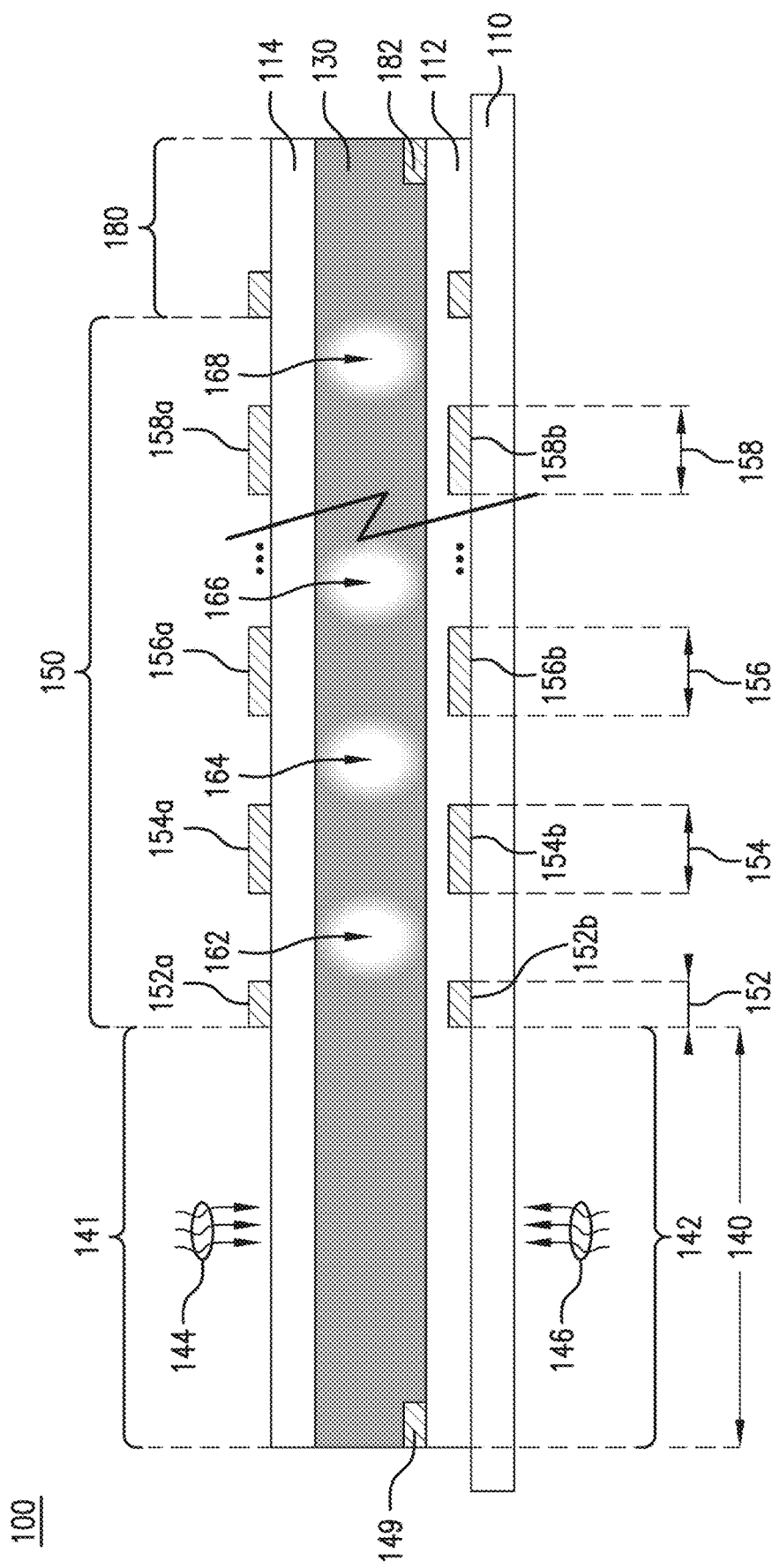
FIG. 1 is a profile view of a multi-well selenium photomultiplier (Se-PM) according to an embodiment of the present disclosure.
Figure 2:
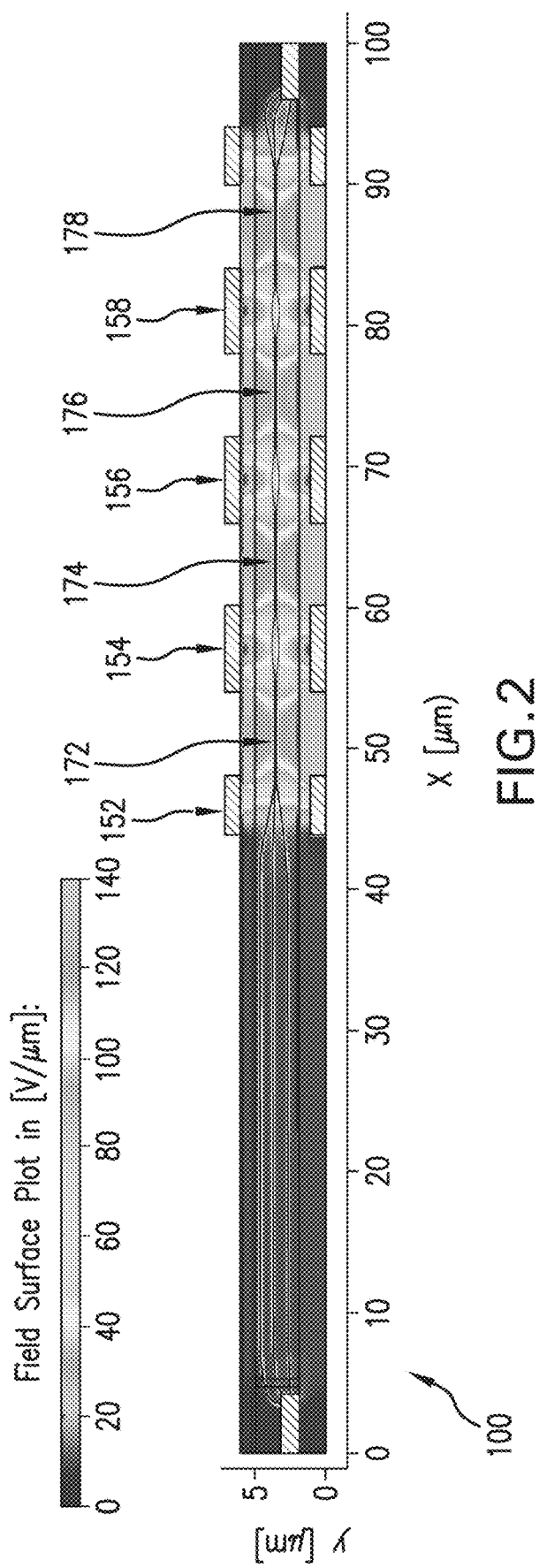
FIG. 2 illustrates field intensity in the Se-PM of FIG. 1.

FIG. 1 is a profile view of a multi-well Se-PM according to an embodiment of the present disclosure. FIG. 2 illustrates field intensity in the Se-PM of FIG. 1 during operation thereof.

As shown in FIGS. 1 and 2, a photomultiplier device is provided with a cascaded lateral, i.e., horizontal, SWAD structure 100, a lower insulator 112, an a-Se photoconductive layer 130, and an upper insulator 114. The a-Se photoconductive layer 130 is positioned between the lower insulator 112 and the upper insulator 114. Dielectric is interchangeable with insulator. A light interaction region 140, an avalanche region 150, and a collection region 180 are provided along a length of the cascaded lateral SWAD structure 100. The light interaction region 140 and the collection region 180 are adjacent to and positioned on opposite sides of the avalanche region 150.

The avalanche region 150 is formed in a longitudinal direction, i.e., along a horizontal orientation, via photolithography, rather than by a vertical film thickness, as in conventional devices. Defining the avalanche region 150 via photolithography creates a stable, reliable and repeatable detector architecture.

The light interaction region 140 has an upper, i.e., front, optical window 141 and a lower, i.e., back, optical window 142, for input of first light 144 and second light 146, from above and below the cascaded lateral SWAD structure 100, respectively.

A high voltage source 149 is provided at a distal end of the light interaction region 140, and a collector 182 is provided at a distal end of the collection region 180, with the high voltage source 149 and the collector 182 provided on opposite horizontal ends of the cascaded lateral SWAD structure 100.

The a-Se photoconductive layer 130 is positioned between the lower insulator 112 and the upper insulator 114. The lower insulator 112 is preferably Polyimide and the upper insulator 114 is preferably a chemical vapor deposited poly(p-xylylene) polymer that provides a moisture and dielectric barrier, e.g., Parylene. The lower insulator 112 is positioned adjacent to and above a substrate 110, which is preferably a glass substrate.

A plurality of grids 152, 154, 156, 158, i.e., lateral Frisch grids, are provided at predetermined intervals along a horizontal length of the avalanche region 150 of the cascaded lateral SWAD structure 100, with each grid of the plurality of grids 152, 154, 156, 158 provided at one or more predetermined distances from an adjacent another grid of the plurality of grids 152, 154, 156, 158.

In the multi-well Se-PM of FIG. 1, each grid of the plurality of grids has opposite first and second parts. That is, grid 152 includes a first part 152a and a second part 152b formed on the upper insulator 114 and lower insulator 112, respectively. Grid 154 includes first part 154a and a second part 154b, grid 156 includes first part 156a and a second part 156b, and grid 158 includes first part 156a and a second part 156b, which are similarly positioned. The grid electrodes can be formed in or on respective the insulator. Since the electric field is low, the grid electrodes need not be encapsulated in the insulator.

A high-field region is created by biasing the electrodes of each grid of the plurality of grids 152, 154, 156, 158, thereby achieving multi-stage avalanche gain. Accordingly, a practical Se-PM is provided with insulating blocking layers that eliminate the formation of field hot-spots inside the a-Se, and also eliminates charge injection from metal to semiconductor, with all grid electrodes being encapsulated with dielectric/insulator.

FIG. 2 shows four amplification stages 172, 174, 176, 178 formed between each of the plurality of grids. FIG. 2 shows voltage variation, with an absence of field hot-spots within the a-Se. Increasing a ratio of the upper and lower optical windows 141, 142 to the overall size of the avalanche region 150 reduces a fill factor due to the amplification stages, at the expense of lower time-resolution.

Reducing the number of grids reduces gain. Alternatively, increasing the number of grids provides corresponding gain increases. Essentially unlimited gain can be obtained by increasing the number of grids. Since grids are added in a horizontal orientation by photolithography, the gain is provided without increasing vertical thickness.

Figure 3:
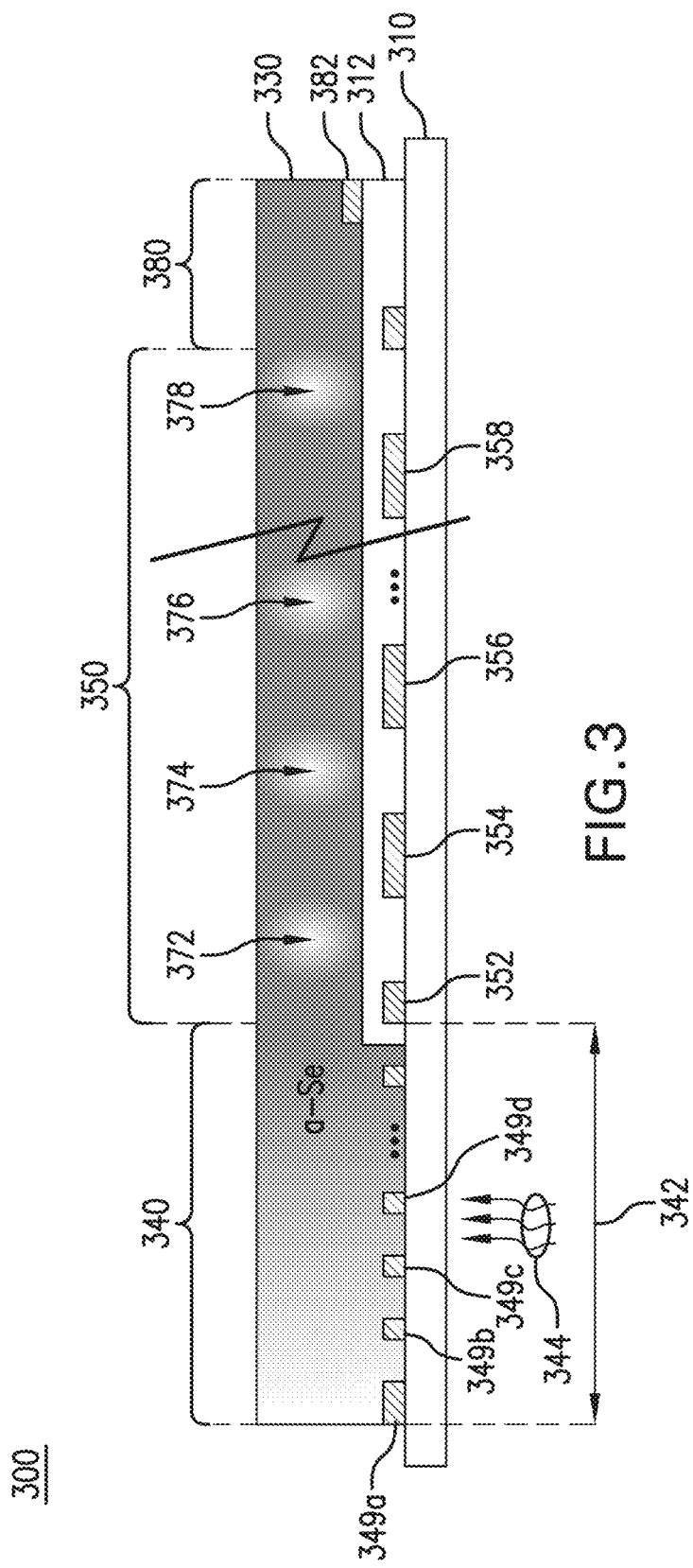
FIG. 3 is a profile view of a multi-well Se-PM according to another embodiment of the present disclosure.
Figure 4:
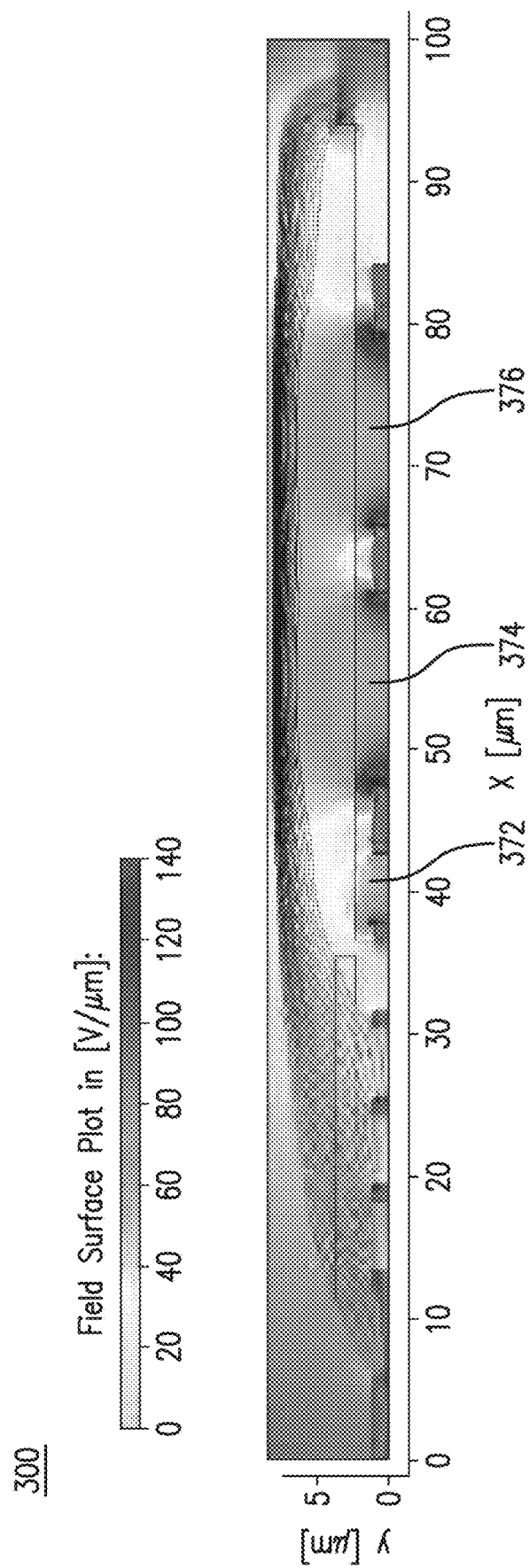
FIG. 4 illustrates field intensity in the Se-PM of FIG. 3.

FIG. 3 is a profile view of a multi-well Se-PM according to another embodiment of the present disclosure. FIG. 4 illustrates field intensity in the Se-PM of FIG. 3 during operation thereof.

As shown in FIGS. 3 and 4, a cascaded lateral SWAD structure 300 is provided with a plurality of grids 352, 354, 356, 358 positioned in interaction region 340, with a plurality of high voltage dividers 349a, 349b, 349c, 349d in the light interaction region 340. The plurality of grids 352, 354, 356, 358 are positioned only on a lower insulator 312. A collection region 380 is provided with collector 382. The other components of FIG. 3 correspond in operation to FIG. 1, and description thereof is not repeated here for conciseness.

FIG. 4 shows Gaussian electric field shaping of the lateral SWAT) by localizing the high-field avalanche region in gain stage 372 between grid 352 and grid 354; and in gain stage 374 between grid 354 and grid 356; in gain stage 376 between grid 356 and grid 358; thereby confining avalanche multiplication between the grid planes and eliminating charge injection from the metal electrodes, Such horizontal multi-stage field shaping achieves gain levels that are not possible with a single-stage vertical avalanche device.

FIGS. 3 and 4 show a weighting potential distribution for the Se-PM, with the grids of the lateral SWAD providing an extremely strong near-field effect in an immediate vicinity of the collector. Signal is induced and sensed by the readout electronics only when avalanched holes drift pass the final grid electrode and reach the collector, as shown in FIG. 4. Accordingly, nearly ideal UM charge sensing is provided with only a physical limit on detector's time resolution in a spatial width of the charge cloud.

As shown in FIG. 4, hot spots are formed on a side of grid 352 closest to gain stage 372, on a side of grid 354 closes to gain stage 374, on both sides of grid 356, and on one side of grid 358 closest to gain stage 378.

Figure 5:
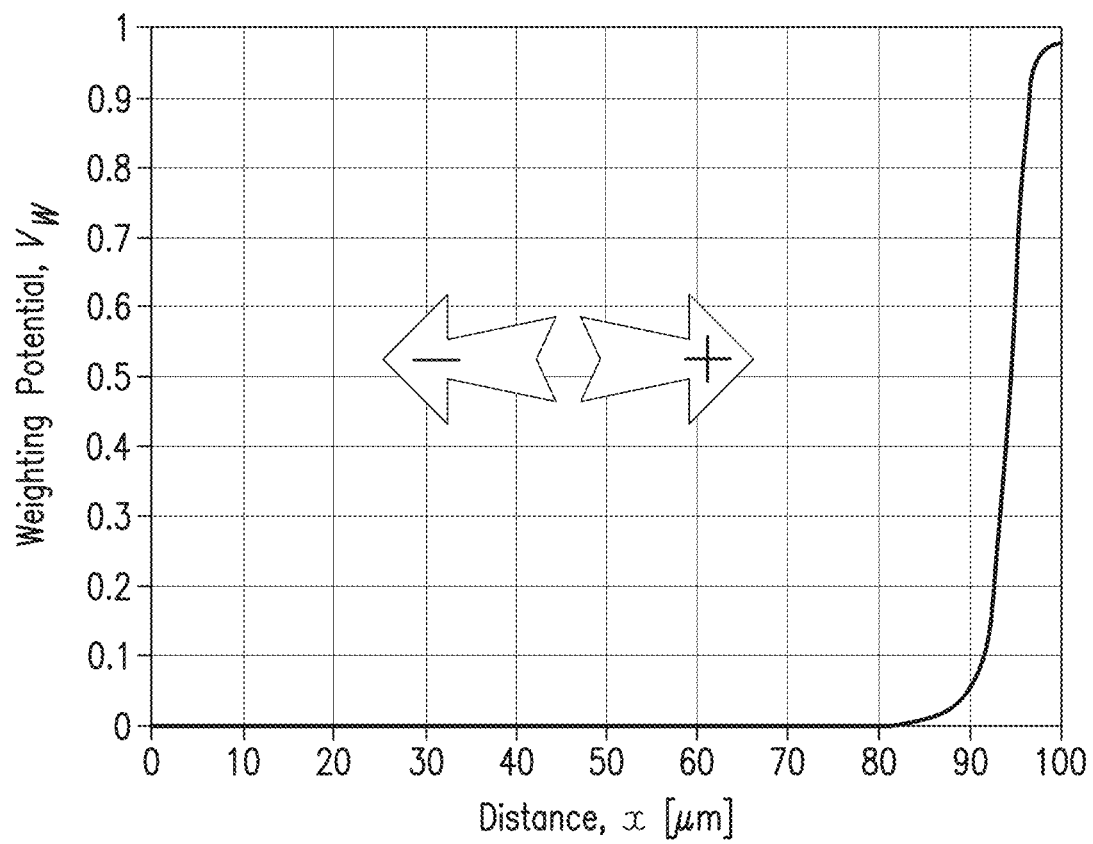
FIG. 5 is a graph showing weighting potential versus distance of the present disclosure.

FIG. 5 is a graph showing weighting potential versus distance of the present disclosure. FIG. 5 illustrates the weighting potential distribution of hole-only charge collection during operation of the horizontal photomultiplier of the present disclosure.

Figure 6A:
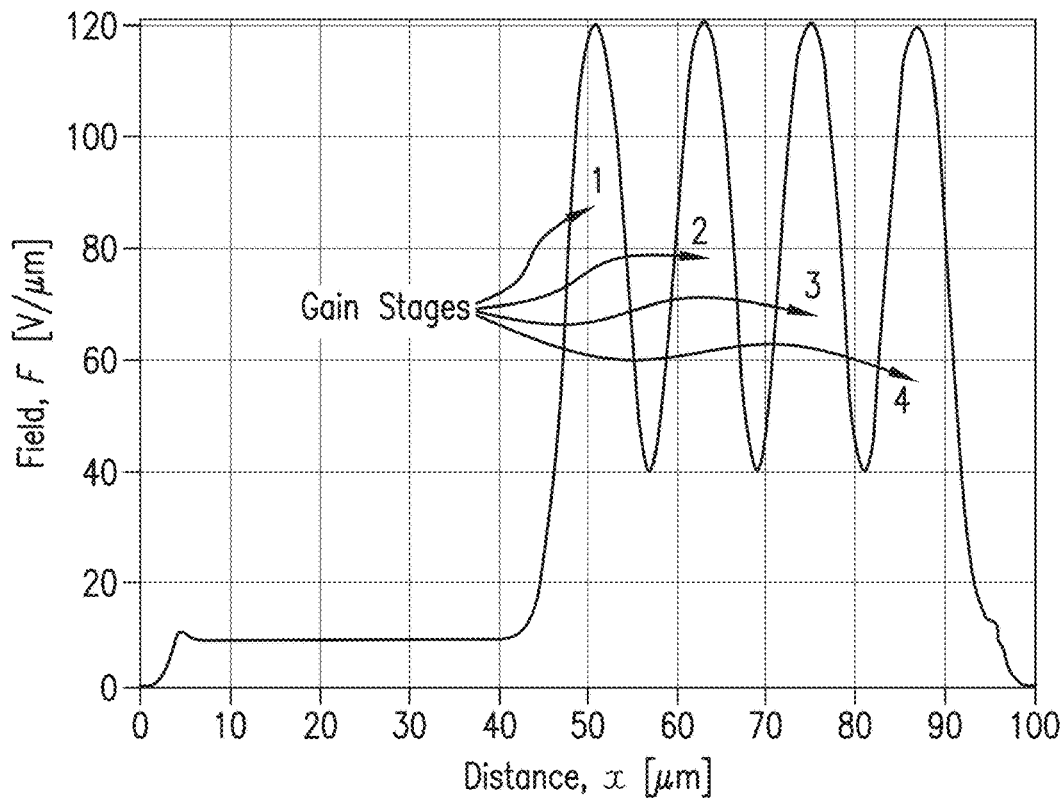
FIG. 6(a) is a graph of field voltage versus distance of the present disclosure.
Figure 6B:
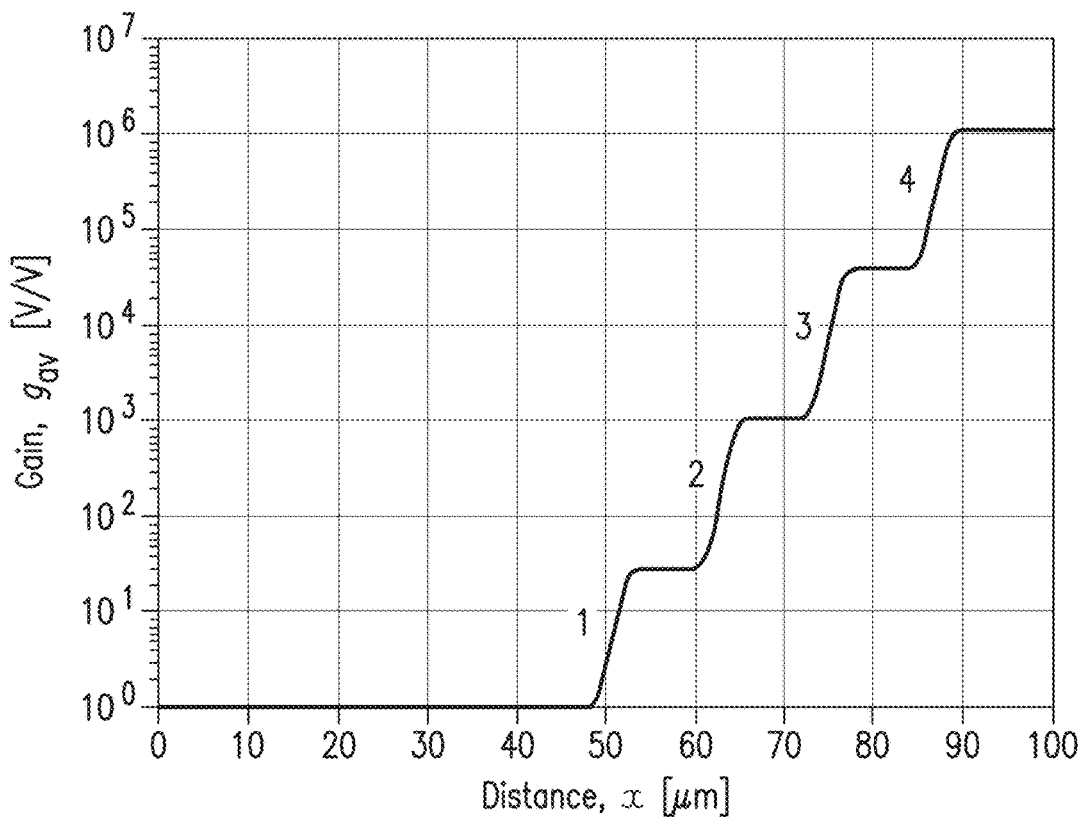
FIG. 6(b) is a graph of gain versus distance of the present disclosure.

FIG. 6(a) is a graph of field voltage versus distance of the present disclosure of cascaded Gaussian field-shaping regions using lateral SWADs with four gain stages. FIG. 6(b) is a graph of gain versus distance of the present disclosure, showing simulated avalanche gain $g_{av}$ of ~$10^6$ [V/V] for a Se-PM with n=4.

While the invention has been shown and described with reference to certain aspects thereof, it will be understood by those skilled in the art that various changes in form and details may be made therein without departing from the spirit and scope of the present invention as defined by the appended claims and equivalents thereof.

REFERENCES

[1] P. P. Webb, R. J. McIntyre, and J. Conrad, RCA review 35, p. 234 (1974).

[2] H. Shimamoto, T. Yamashita et al., IEEE Micro 31, p. 51 (2011).

[3] A. H. Goldan, O. Tousignant et al., Appl. Phys. Lett. 101, p. 213503 (2012).

[4] A. H. Goldan, J. A. Rowlands, O. Tousignant et al., J. Appl. Phys. 113 (2013).

[5] A. H. Goldan and W. Zhao, Med, Phys. 40, p. 010702 (2013).

[6] A. H. Goldan, J. A. Rowlands, M. Lu, and W. Zhao, Proc. Conf. Rec. IEEE NSS/MIC N32-4, Seattle, Wash. 2014).

[7] Sauli, GEM: A new concept for electron amplification in gas detectors. Nucl. Instr. and Meth. A, 386(2-3):531-534, 1997.

What is claimed is:

1. A photomultiplier with a field-shaping multi-well avalanche detector, comprising:
 a lower insulator;
 an a-Se photoconductive layer; and
 an upper insulator,
 wherein the a-Se photoconductive layer is between the lower insulator and the upper insulator,
 wherein a light interaction region, an avalanche region, and a collection region are provided along a length of the photomultiplier,
 wherein the light interaction region and the collection region are positioned on opposite sides of the avalanche region,
 wherein the light interaction region comprising an upper optical window and a lower optical window,
 wherein the upper optical window is configured for input of first light from above the field-shaping multi-well avalanche detector, and
 wherein the lower optical window is configured for input of second light from below the field-shaping multi-well avalanche detector.

2. The photomultiplier of claim 1, wherein the a-Se photoconductive layer is positioned between the lower insulator and the upper insulator.

3. The photomultiplier of claim 1, wherein the avalanche region is formed in a horizontal orientation.

4. The photomultiplier of claim 1, wherein the avalanche region is formed via photolithography.

5. The photomultiplier of claim 1, further comprising:
 a high voltage source positioned at a distal end of the light interaction region; and
 a collector positioned at a distal end of the collection region.

6. The photomultiplier of claim 5, wherein the high voltage source and the collector are positioned on opposite horizontal ends of the field-shaping multi-well avalanche detector to form an electric field therebetween.

7. The photomultiplier of claim 1, further comprising a plurality of grids along a horizontal length of the avalanche region.

8. The photomultiplier of claim 7, wherein each grid of the plurality of grids provided at a predetermined distance from an adjacent another grid of the plurality of grids.

9. The photomultiplier of claim 7, wherein the plurality of grids form a plurality of lateral Frisch grids with a plurality of amplification stages therebetween.

10. The photomultiplier of claim 7, wherein the plurality of grids are biased to create a high-field region, to provide multi-stage avalanche gain that eliminates formation of field hot-spots inside the a-Se.

11. The photomultiplier of claim 10, wherein the multi-stage avalanche gain is confined between grid planes of the plurality of grids and charge injection from metal electrodes is eliminated.

12. The photomultiplier of claim 7, wherein the plurality of grids are positioned at predetermined intervals along the horizontal length of the avalanche region.

13. The photomultiplier of claim 1, wherein the a-Se photoconductive layer and the upper insulator are formed on the lower insulator in a vertical orientation.

14. A photomultiplier with a field-shaping multi-well avalanche detector, comprising:
a lower insulator;
an upper insulator;
an a-Se photoconductive layer between the lower insulator and the upper insulator;
a high voltage source positioned at a distal end of the light interaction region; and
a collector positioned at a distal end of the collection region,
wherein a light interaction region, an avalanche region, and a collection region are provided along a length of the photomultiplier,
wherein the light interaction region and the collection region are positioned on opposite sides of the avalanche region, and
wherein the high voltage source and the collector are positioned on opposite horizontal ends of the field-shaping multi-well avalanche detector to form an electric field therebetween.

15. A photomultiplier with a field-shaping multi-well avalanche detector, comprising:
a lower insulator;
an a-Se photoconductive layer;
an upper insulator; and
a plurality of grids positioned at predetermined intervals along a horizontal length of the avalanche region,
wherein the a-Se photoconductive layer is between the lower insulator and the upper insulator,
wherein a light interaction region, an avalanche region, and a collection region are provided along a length of the photomultiplier,
wherein the light interaction region and the collection region are positioned on opposite sides of the avalanche region, and
wherein the plurality of grids form a plurality of lateral Frisch grids with a plurality of amplification stages therebetween.

16. A photomultiplier with a field-shaping multi-well avalanche detector, comprising:
a lower insulator;
an upper insulator;
an a-Se photoconductive layer between the lower insulator and the upper insulator; and
a plurality of grids positioned along a horizontal length of an avalanche region,
wherein a light interaction region, the avalanche region, and a collection region are provided along a length of the photomultiplier,
wherein the light interaction region and the collection region are positioned on opposite sides of the avalanche region, and
wherein the plurality of grids are biased to create a high-field region and provide multi-stage avalanche gain.

17. The photomultiplier of claim 16, wherein the multi-stage avalanche gain eliminates field hot-spot formation inside the a-Se.

18. The photomultiplier of claim 16, wherein the plurality of grids are biased to eliminate charge injection from high-field metal-semiconductor interfaces.

19. The photomultiplier of claim 16, wherein the multi-stage avalanche gain is confined between grid planes of the plurality of grids.

20. The photomultiplier of claim 19, wherein confining the multi-stage avalanche gain between grid planes of the plurality of grids eliminates charge injection from metal electrodes.

* * * * *